(12) United States Patent

Ardisana, II et al.

(10) Patent No.: US 12,712,212 B2

(45) Date of Patent: Aug. 18, 2026

(54) BATTERY PACK PROTECTION CIRCUIT MODULE

(71) Applicant: Snap Inc., Santa Monica, CA (US)

(72) Inventors: John Bernard Ardisana, II, Torrance, CA (US); Yoav Ben-Haim, Venice, CA (US); Teodor Dabov, Los Angeles, CA (US); Douglas Wayne Moskowitz, Marina Del Rey, CA (US)

(73) Assignee: Snap Inc., Santa Monica, CA (US)

( * ) Notice: Subject to any disclaimer, the term of this patent is extended or adjusted under 35 U.S.C. 154(b) by 798 days.

(21) Appl. No.: 18/059,203

(22) Filed: Nov. 28, 2022

(65) Prior Publication Data

US 2023/0093458 A1 Mar. 23, 2023

Related U.S. Application Data

(63) Continuation of application No. 16/142,885, filed on Sep. 26, 2018, now Pat. No. 11,515,575.

(Continued)

(51) Int. Cl.

*H01M 10/42* (2006.01)

*H01M 50/55* (2021.01)

(Continued)

(52) U.S. Cl.

CPC ......... *H01M 10/425* (2013.01); *H01M 50/55* (2021.01); *H01M 50/553* (2021.01);

(Continued)

(58) Field of Classification Search

CPC .. H01M 10/425; H01M 50/55; H01M 50/553; H01M 2010/4271; H05K 1/181;

(Continued)

(56) References Cited

U.S. PATENT DOCUMENTS

| | | | |
|---|---|---|---|
| 9,711,799 | B1 | 7/2017 | Lai et al. |
| 11,515,575 | B2 | 11/2022 | Ardisana, II et al. |

(Continued)

FOREIGN PATENT DOCUMENTS

| | | |
|---|---|---|
| CN | 1416599 | 5/2003 |
| CN | 1508892 | 6/2004 |

(Continued)

OTHER PUBLICATIONS

"U.S. Appl. No. 16/142,885, Appeal Brief filed Jan. 12, 2022", 16 pgs.

(Continued)

*Primary Examiner* — Lisa S Park

(74) *Attorney, Agent, or Firm* — Schwegman Lundberg & Woessner, P.A.

(57) ABSTRACT

A secondary battery pack comprises a battery and a protection circuit module (PCM), a pair of electrodes of the battery being connected to a protection circuit board (PCB) forming part of the PCM such that the electrode connections are located on a face of the PCB other than a major face that receives PCM components thereon. In some embodiments, the PCM components are mounted on one of a pair of major faces of the PCB, the electrode connections being located on the opposite one of the major faces. In other embodiments, the electrode connections are located on a peripheral edge face that extends transversely between the pair of major outer faces of the PCB. The spatial arrangement of the electrode connections and the PCM components on the PCB is such that substantially the entirety of one major outer face of the PCB is available for the placement of PCM components.

11 Claims, 6 Drawing Sheets

Related U.S. Application Data

(60) Provisional application No. 62/579,604, filed on Oct. 31, 2017.

(51) Int. Cl.
*H01M 50/553* (2021.01)
*H05K 1/181* (2026.01)
*H05K 3/32* (2006.01)

(52) U.S. Cl.
CPC ............... *H05K 1/181* (2013.01); *H05K 3/32* (2013.01); *H01M 2010/4271* (2013.01); *H05K 2201/10037* (2013.01)

(58) Field of Classification Search
CPC . H05K 3/32; H05K 2201/10037; Y02E 60/10
See application file for complete search history.

(56) References Cited

U.S. PATENT DOCUMENTS

| | | | | |
|---|---|---|---|---|
| 11,670,805 | B2 | 6/2023 | Ardisana, II et al. | |
| 12,243,987 | B2 | 3/2025 | Ardisana, II et al. | |
| 2003/0146734 | A1* | 8/2003 | Kozu | H01M 50/55 320/107 |
| 2004/0119442 | A1 | 6/2004 | Lee et al. | |
| 2007/0231682 | A1* | 10/2007 | Aoyama | H01M 50/553 429/152 |
| 2008/0176131 | A1 | 7/2008 | Seo et al. | |
| 2009/0297942 | A1 | 12/2009 | Jang et al. | |
| 2010/0112425 | A1 | 5/2010 | Dunn | |
| 2011/0256428 | A1* | 10/2011 | Ho | H01M 50/213 429/7 |
| 2012/0121936 | A1 | 5/2012 | Baek et al. | |
| 2012/0308849 | A1 | 12/2012 | Tortstensson et al. | |
| 2013/0149562 | A1 | 6/2013 | Lee et al. | |
| 2015/0223320 | A1 | 8/2015 | Gerhuer | |
| 2017/0005318 | A1 | 1/2017 | Otohata | |
| 2018/0070484 | A1 | 3/2018 | Mundell et al. | |
| 2019/0131663 | A1 | 5/2019 | Ardisana, II et al. | |
| 2019/0131664 | A1 | 5/2019 | Ardisana, II et al. | |
| 2023/0253634 | A1 | 8/2023 | Ardisana, II et al. | |
| 2025/0201943 | A1 | 6/2025 | Ardisana, II et al. | |

FOREIGN PATENT DOCUMENTS

| | | | |
|---|---|---|---|
| CN | 1890824 | | 1/2007 |
| CN | 101523656 | | 9/2009 |
| CN | 103165934 | | 6/2013 |
| CN | 105765765 | | 7/2016 |
| CN | 111247684 | A | 6/2020 |
| CN | 111295795 | A | 6/2020 |
| CN | 111247684 | | 7/2023 |
| CN | 111295795 | | 7/2023 |
| CN | 116666784 | | 8/2023 |
| CN | 116683054 | | 9/2023 |
| EP | 3704758 | B1 | 10/2024 |
| JP | 2002289160 | A | 10/2002 |
| JP | 2003-168408 | * | 6/2003 |
| KR | 20020087079 | | 11/2002 |
| KR | 20040054233 | | 6/2004 |
| KR | 20120122860 | A | 11/2012 |
| KR | 20130065289 | A | 6/2013 |
| KR | 20140097731 | | 8/2014 |
| KR | 102458158 | | 10/2022 |
| KR | 102483248 | | 12/2022 |
| KR | 102676094 | B1 | 6/2024 |
| KR | 102786995 | B1 | 3/2025 |
| WO | WO-2019089797 | A1 | 5/2019 |
| WO | WO-2019089814 | A1 | 5/2019 |

OTHER PUBLICATIONS

"U.S. Appl. No. 16/142,885, Final Office Action mailed Feb. 11, 2021", 12 pgs.
"U.S. Appl. No. 16/142,885, Final Office Action mailed Sep. 1, 2020", 12 pgs.
"U.S. Appl. No. 16/142,885, Non Final Office Action mailed Feb. 1, 2022", 12 pgs.
"U.S. Appl. No. 16/142,885, Non Final Office Action mailed Mar. 20, 2020", 7 pgs.
"U.S. Appl. No. 16/142,885, Notice of Allowance mailed Jul. 26, 2022", 7 pgs.
"U.S. Appl. No. 16/142,885, Notice of Non-Compliant Amendment mailed Feb. 5, 2021", 2 pgs.
"U.S. Appl. No. 16/142,885, Response filed Feb. 1, 2021 to Final Office Action mailed Sep. 1, 2020", 10 pgs.
"U.S. Appl. No. 16/142,885, Response filed Jun. 22, 2020 to Non Final Office Action mailed Mar. 20, 2020", 10 pgs.
"U.S. Appl. No. 16/142,885, Response filed Jul. 1, 2022 to Non Final Office Action mailed Feb. 1, 2022", 11 pgs.
"U.S. Appl. No. 16/143,029, Final Office Action mailed Jan. 31, 2022", 13 pgs.
"U.S. Appl. No. 16/143,029, Final Office Action mailed Nov. 17, 2020", 11 pgs.
"U.S. Appl. No. 16/143,029, Non Final Office Action mailed Jun. 2, 2021", 12 pgs.
"U.S. Appl. No. 16/143,029, Non Final Office Action mailed Jul. 28, 2020", 12 pgs.
"U.S. Appl. No. 16/143,029, Non Final Office Action mailed Sep. 8, 2022", 12 pgs.
"U.S. Appl. No. 16/143,029, Response filed Apr. 19, 2021 to Final Office Action mailed Nov. 17, 2020", 7 pgs.
"U.S. Appl. No. 16/143,029, Response filed Jul. 7, 2020 to Restriction Requirement mailed Apr. 7, 2020", 7 pgs.
"U.S. Appl. No. 16/143,029, Response Filed Jun. 30, 2022 to Final Office Action Mailed Jan. 31, 2022", 9 pgs.
"U.S. Appl. No. 16/143,029, Response filed Oct. 28, 2020 to Non Final Office Action mailed Jul. 28, 2020", 8 pgs.
"U.S. Appl. No. 16/143,029, Response filed Dec. 2, 2021 to Non Final Office Action mailed Jun. 2, 2021", 7 pgs.
"U.S. Appl. No. 16/143,029, Restriction Requirement mailed Apr. 7, 2020", 6 pgs.
"European Application Serial No. 18804205.5, Response to Communication pursuant to Rules 161(1) and 162 EPC filed Dec. 15, 2020", 23 pgs.
"European Application Serial No. 18811405.2, Communication Pursuant to Article 94(3) EPC mailed Feb. 9, 2021", 5 pgs.
"European Application Serial No. 18811405.2, Response filed Jun. 9, 2021 to Communication Pursuant to Article 94(3) EPC mailed Feb. 9, 2021", 23 pgs.
"International Application Serial No. PCT/US2018/058513, International Preliminary Report on Patentability mailed May 14, 2020", 8 pgs.
"International Application Serial No. PCT/US2018/058513, International Search Report mailed Apr. 23, 2019", 4 pgs.
"International Application Serial No. PCT/US2018/058513, Written Opinion mailed Apr. 23, 2019", 6 pgs.
"International Application Serial No. PCT/US2018/058536, International Preliminary Report on Patentability mailed May 14, 2020", 8 pgs.
"International Application Serial No. PCT/US2018/058536, International Search Report mailed Feb. 25, 2019", 5 pgs.
"International Application Serial No. PCT/US2018/058536, Written Opinion mailed Feb. 25, 2019", 6 pgs.
"Korean Application Serial No. 10-2020-7015171, Notice of Preliminary Rejection mailed Dec. 23, 2021", With English machine translation, 35 pgs.
"Korean Application Serial No. 10-2020-7015244, Notice of Preliminary Rejection mailed Dec. 23, 2021", With English translation, 15 pgs.
"MPEP 2144.04: Legal Precedent as Source of Supporting Rational [R-10.2019]", (2019), 4 pgs.
"Korean Application Serial No. 10-2022-7045832, Response filed Aug. 22, 2023 to Notice of Preliminary Rejection mailed Feb. 22, 2023", w English Claims, 14 pgs.

(56) References Cited

OTHER PUBLICATIONS

"Korean Application Serial No. 10-2022-7036397, Response Filed Aug. 21, 2023 to Notice of Preliminary Rejection mailed Feb. 22, 2023", With English Machine Translation, 14 pgs.
"Korean Application Serial No. 10-2022-7036397, Final Office Action mailed Dec. 20, 2023", w English Translation, 5 pgs.
"Korean Application Serial No. 10-2022-7045832, Notice of Preliminary Rejection mailed Dec. 26, 2023", w English Translation, 10 pgs.
"Chinese Application Serial No. 201880070750.2, Response filed Mar. 1, 2023 to Office Action mailed Nov. 1, 2022", w English Claims, 12 pgs.
"Chinese Application Serial No. 201880067365.2, Response filed Mar. 2, 2023 to Office Action mailed Oct. 26, 2022", w English Claims, 11 pgs.
"U.S. Appl. No. 16/143,029, Notice of Allowance mailed Jan. 30, 2023", 7 pgs.
"Korean Application Serial No. 10-2022-7036397, Notice of Preliminary Rejection mailed Feb. 22, 2023", w English Translation, 17 pgs.
"Korean Application Serial No. 10-2022-7045832, Notice of Preliminary Rejection mailed Feb. 22, 2023", w English Translation, 15 pgs.
"U.S. Appl. No. 16/143,029, Response filed Dec. 8, 2022 to Non Final Office Action mailed Sep. 8, 2022", 9 pgs.
"Chinese Application Serial No. 201880067365.2, Office Action mailed Oct. 26, 2022", w English Translation, 14 pgs.
"Chinese Application Serial No. 201880070750.2, Office Action mailed Nov. 1, 2022", w English Translation, 14 pgs.
"U.S. Appl. No. 18/301,744, Non Final Office Action mailed Jul. 9, 2024", 6 pgs.
"U.S. Appl. No. 18/301,744, Notice of Allowance mailed Nov. 1, 2024", 7 pgs.
"U.S. Appl. No. 18/301,744, Response filed Oct. 8, 2024 to Non Final Office Action mailed Jul. 9, 2024", 11 pgs.
"European Application Serial No. 18811405.2, Communication Pursuant to Article 94(3) EPC mailed Feb. 4, 2025", 4 pgs.
"European Application Serial No. 18811405.2, Response filed Jun. 3, 2025 to Communication Pursuant to Article 94(3) EPC mailed Feb. 4, 2025", 7 pgs.
"Korean Application Serial No. 10-2022-7036397, Request for Reexamination filed Mar. 6, 2024 to Final Office Action mailed Dec. 20, 2023", w/ English claims, 15 pgs.
"Korean Application Serial No. 10-2022-7045832, Response filed Jun. 26, 2024 to Notice of Preliminary Rejection mailed Dec. 26, 2023", w/ English claims, 19 pgs.
U.S. Appl. No. 18/301,744, filed Apr. 17, 2023, Nested PCM Battery Pack.

* cited by examiner

BATTERY PACK PROTECTION CIRCUIT MODULE

CLAIM OF PRIORITY

This application is a continuation of U.S. patent application Ser. No. 16/142,885, filed on Sep. 26, 2018, and issued as U.S. Pat. No. 11,515,575, which claims the benefit of priority to U.S. Provisional Application Ser. No. 62/579,604, filed on Oct. 31, 2017, each of which are hereby incorporated by reference herein in their entireties.

BACKGROUND

A common mechanism for providing battery power to portable electronic devices is by use of modular secondary battery packs. Such battery packs often employ rechargeable lithium-ion based battery cells, such as lithium-ion polymer battery cells, also known as Li-Poly, Li-Pol, or LiPo cells.

A protection circuit module (PCM) is usually included in the battery pack, being connected to the battery cell by a pair of electrodes to perform protective functions with respect to operation of the battery cell. Typical functions of the PCM include preventing overcharge, preventing over discharge, and preventing over-current of the battery cell.

In many electronic devices, including mobile devices such as mobile phones and wearable devices such as smart glasses, space is at a premium, demanding increasing space-saving in battery pack design. Space-saving in battery packs can, however, come at a cost when the available space/volume for PCM components is reduced to suboptimal levels.

BRIEF DESCRIPTION OF THE DRAWINGS

Various ones of the appended drawings merely illustrate example embodiments of the present disclosure and cannot be considered as limiting its scope. To facilitate collation of numbered items in the description to the drawings, the first digit of each numbered item corresponds to the figure in which that item first appears. In the drawings:

FIG. 1A is a schematic three-dimensional view of an existing battery pack, in which a PCM insulation cover is removed for clarity of view. FIG. 1B is a partial cross-section, on an enlarged scale, of the existing battery pack of FIG. 1A.

The headings provided herein are merely for convenience and do not necessarily affect the scope or meaning of the terms used.

TECHNICAL BACKGROUND

Figure 1A:
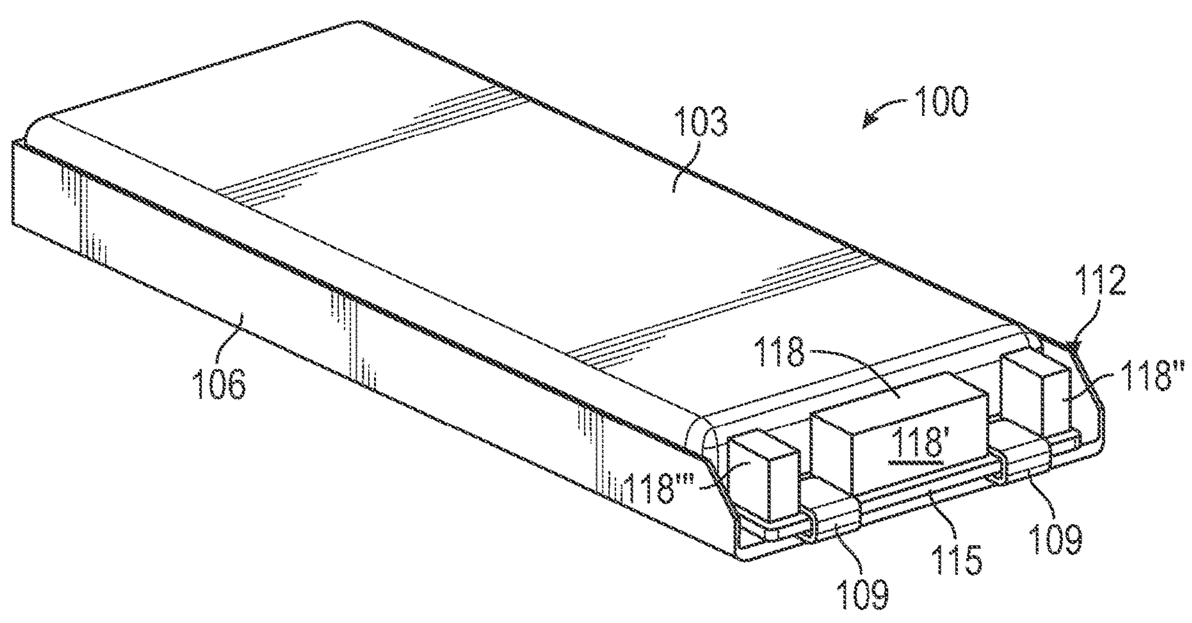
FIG. 1A and 1B shows a battery pack according to existing structural arrangements.
Figure 1B:
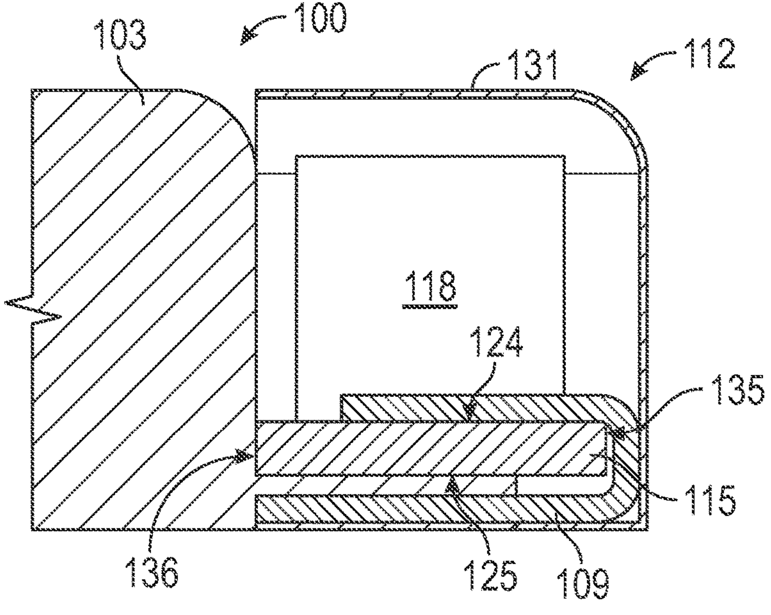

FIGS. 1A and 1B show an example of an existing battery pack structure. The conventional battery pack 100 of FIG. 1A includes a lithium polymer battery cell 103 coupled to a safety circuit in the form of a protection circuit module (PCM) 112. As mentioned previously, the PCM 112 provides power control functionality to the battery cell 103, e.g. for safety purposes. Typically, the PCM prevents overcharge, over-discharge, and/or overcurrent in the battery cell 103. The PCM 112 is connected to the battery cell 103 by a pair of electrodes 109 that project from the battery cell 103. In conventional fashion, the pair of electrodes 109 are terminals of the battery cell 103, consisting of a cathode and an anode.

The PCM 112 comprises a printed circuit board or protection circuit board (PCB) 115 and a plurality of PCM components mounted on the PCB 115, the available volume for location of PCM components on the PCB 115 being indicated in the drawings by PCM block 118. It will be appreciated that the PCB 115 comprises a rectangular substrate carrying an integrated protection circuit thereon for connection to the PCM components and to the battery electrodes 109. To facilitate modular use of the battery pack 100, the assembly consisting of the battery cell 103 and the PCM 112 is housed in a casing 106, part of which provides insulation 131 covering for the PCM 112. For clarity of view, the insulation 131 and its analogs are consistently omitted from schematic three-dimensional views of respective embodiments, such as in the FIGS. 1A, 2A, and 3B.

Having a relatively thin, elongate rectangular shape, the PCB 115 has a pair of substantially rectangular major outer surfaces which are substantially parallel to one another and which face in opposite outward directions. In FIG. 1B, these opposite major faces are designated as a top face 124 and a bottom face 125. Note that in this description, reference to the top and bottom faces do not indicate a particular orientation or spatial attribute of the respective faces, but is instead used as monikers to distinguish between these two faces in description. For consistency of description, that face of the PCB 115 on which all or the majority of contacts or nodes of the integrated protective circuit are available for connection of PCM components is, unless the context clearly indicates otherwise, referred to as the top face 124.

The top and bottom faces 124, 125 are connected by a peripheral edge face that extends transversely between them. The edge face includes a pair of end edge faces at the longitudinal end edges of the PCB 115, and a pair of side edge faces 135, 136 at the lateral side edges of the PCB 115. For clarity, the side edge faces (best seen in FIG. 1B) are designated as a front edge face 135 furthest from the battery cell 103, and a rear edge face 136 closest to the battery cell 103. The PCB 115 is oriented such that a widthwise dimension of the PCB 115 (i.e., the dimension extending between the side edge faces 135, 136) is substantially parallel to the lengthwise direction of the battery cell 103. A lengthwise direction of the PCB 115 (i.e., the dimension of the PCB 115 that extends between its end edges) is oriented transversely to the lengthwise direction of the battery cell 103. The thickness dimension of the PCB 115 (i.e., that dimension of the PCB 115 that extends between the top face 124 and the bottom face 125), being normal to the widthwise dimension, is oriented transversely to the lengthwise direction of the battery cell 103.

As seen in FIGS. 1A and 1B, connections of the respective electrodes 109 to the PCB 115 are in the existing battery back 100 located on the top face 124 of the PCB 115. Respective metal tabs (e.g., copper tabs) that provide the electrodes 109 project longitudinally (relatively to the lengthwise direction of the battery cell 103) from the battery cell 103, pass beneath the bottom face 125 of the PCB 115, and are bent 180° to fold over into contact with the top face 124. The electrodes 109 are typically soldered to respective metal terminal pads provided on the PCB 115. In this example, the metal terminal pads are gold-plated surfaces forming part of the protection circuit carried by the PCB 115.

Location of the electrode contacts on the top face 124 interrupts the available space for the PCM block 118, so that the cumulative available volume for PCM components on the PCB top face 124 are given by the sum of three separate sub-blocks, indicated as 118', 118'', and 118'''.

DETAILED DESCRIPTION

The description that follows includes devices, systems, methods, techniques, instruction sequences, and computing machine program products that embody illustrative embodiments of the disclosure. In the following description, for the purposes of explanation, numerous specific details are set forth in order to provide an understanding of various embodiments of the disclosed subject matter. It will be evident, however, to those skilled in the art, that embodiments of the disclosed subject matter may be practiced without these specific details. In general, well-known instruction instances, protocols, structures, and techniques are not necessarily shown in detail.

One aspect of the disclosure provides for locating electrode connections of a battery cell to a PCM's PCB on a face of the PCB other than a major face that receives PCM components thereon. Such separation of electrode connections from the major face of the PCB on which PCM components are mounted makes available for the mounting of PCM components substantially the entirety of the PCM-hosting major face of the PCB.

As will be described below with reference to a number of example embodiments, electrode connections to the PCB may be provided on its edge face, or on a bottom face opposite the top face on which the PCM components are mounted. In example embodiments in which the electrodes are connected to the PCB on its edge face, enlarged terminal pads (e.g. being widened relative to a main connective portion of the electrode projecting from the battery cell) may be provided on the edge face of the PCB, for example by copper plated surfaces.

In some example embodiments in which the electrodes are connected to the bottom face of the PCB, the PCB may have an orientation in which its thickness dimension is substantially parallel to the lengthwise direction of the battery cell (thus having an orientation rotated more or less than 90° relative to the position of the PCB 115 shown in FIG. 1B). In some such embodiments, the battery pack may comprise a pair of battery cells flanking the PCB, with both of the battery cells being connected to the PCB such that respective PCM modules of the two battery cells share a single PCB in common.

A number of specific example embodiments will now be described in greater detail with reference to the FIGS. 2-5. For ease of understanding, the same reference numerals are used for indicating corresponding parts or elements in FIG. 1 and in FIGS. 2-5, even when there are in some instances differences between the specifics of the corresponding parts or elements.

Figure 2A:
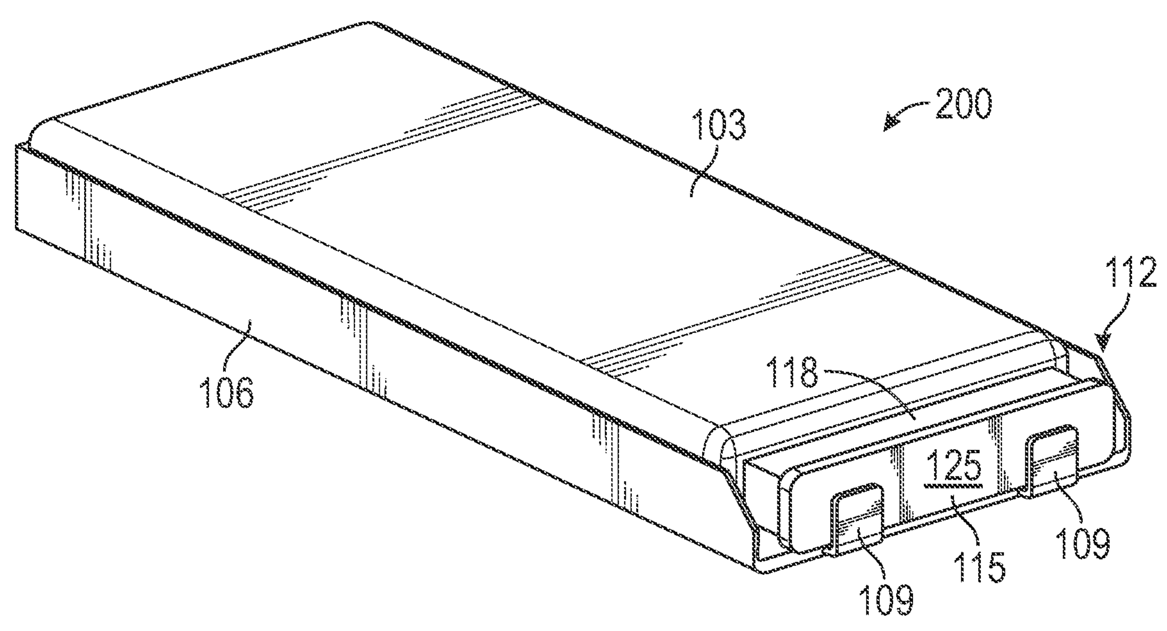
FIG. 2A is a partially exposed schematic three-dimensional view of a battery pack according to one example embodiment, a PCM insulation cover being omitted for clarity of illustration.
Figure 2B:
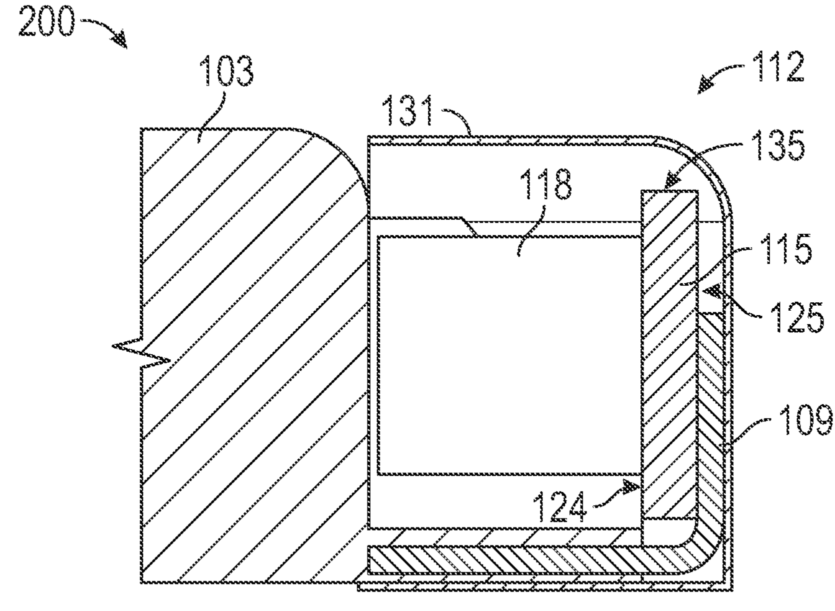
FIG. 2B is a partial cross-section, on an enlarged scale, of the example battery pack of FIG. 2A.

FIGS. 2A and 2B show an example battery pack 200 in which the electrodes 109 are conductively coupled to the PCB 115 on its bottom face 125. This is in contradistinction to the conventional coupling of the electrodes 109 to the top face 124 of the PCB 115, as discussed with reference to FIG. 1. A further difference between the prior battery pack construction of FIG. 1 and the example embodiment of FIG. 2 is that the PCB 115 has a different orientation, in that its widthwise dimension is oriented transversely relative to the lengthwise direction of the battery cell 103. This can best be seen in the sectional side view of FIG. 2B, in which the lengthwise direction of the battery cell 103 extends from left to right, with the widthwise dimension of the PCB 115 extending vertically. (It will be appreciated that the thickness dimension of the PCB 115 extends horizontally in FIG. 2B, parallel to the lengthwise direction of the batter cell 103).

In this example embodiment, the upright orientation of the PCB 115 is such that the top face 124 faces towards the battery cell 103, the bottom face 125 facing away from the battery cell 103. The PCM block 118 with its various components are located on the top face 124, thus being sandwiched between the PCB 115 and battery cell 103. The electrodes 109 project longitudinally from the battery cell 103, extending past the PCM block 118 and the PCB 115, being bent through about 90° to lie flat against and in contact with the bottom face 125 of the PCB 115.

The bottom face of the PCB 115 provides respective conductive terminal pads to which the electrodes 109 are connected, the terminal pads being coupled to the integrated protection circuit of the PCB 115 to provide an electronic connection between the electrodes 109 and the PCM components forming part of the PCM block 118. In this example embodiment, the terminal pads on the bottom face 125 are gold-plated surfaces to which the respective electrodes are soldered.

Note that location of the electrode connections on the bottom face 125, together with spatial arrangement of the PCB 115 such that the electrodes 109 do not pass over the top face 124, leaves substantially the entirety of the top face 124 available for PCM component connection, so that the PCM block 118 is uninterrupted by the electrodes. Such additional free area on the top face 124 (when compared to a typical existing device such as the battery pack 100 of FIG. 1) can be optimized to allow for a more compact PCB. For example, the height of the uninterrupted PCM block 118 of the battery pack 200 can be reduced, while providing the same PCM volume as is the case for the interrupted PCM sub blocks 118', 118'', and 118''' FIG. 1A. Such a reduction in maximal dimensions of the PCM block 118 can in turn be utilized to achieve a reduction in the maximal dimensions of the PCM module 112 as a whole, allowing for a smaller battery pack 200 with similar performance attributes, or allowing for the battery pack 200 to have a larger, greater capacity battery cell 103 for a constant battery pack size.

Figure 3A:
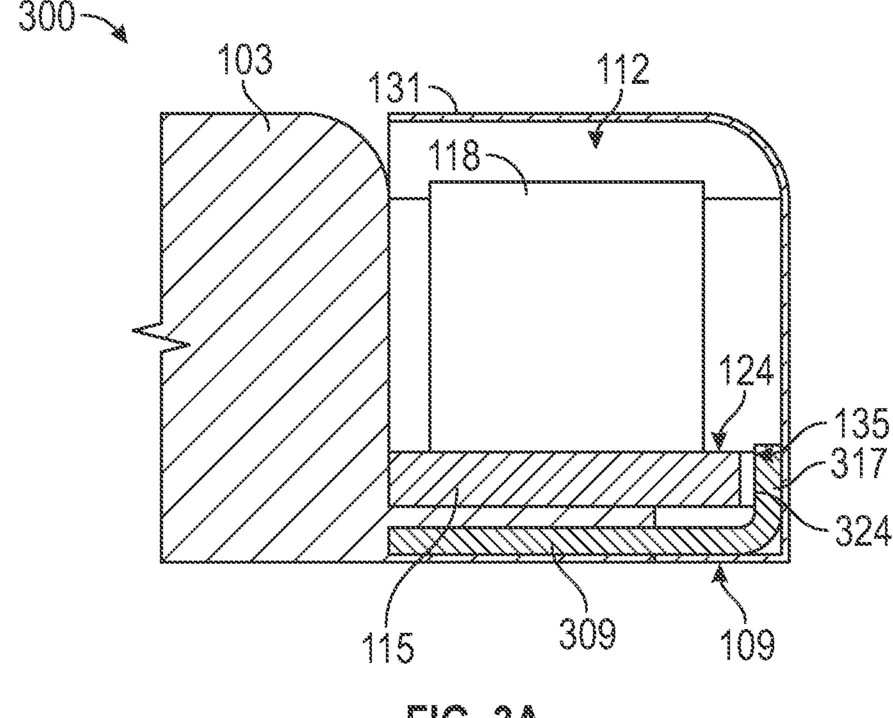
FIG. 3A is a schematic partial cross-section of a battery pack according to another example embodiment, in which electrode terminals are provided on an edge face of a protective circuit board (PCB) of the PCM.
Figure 3B:
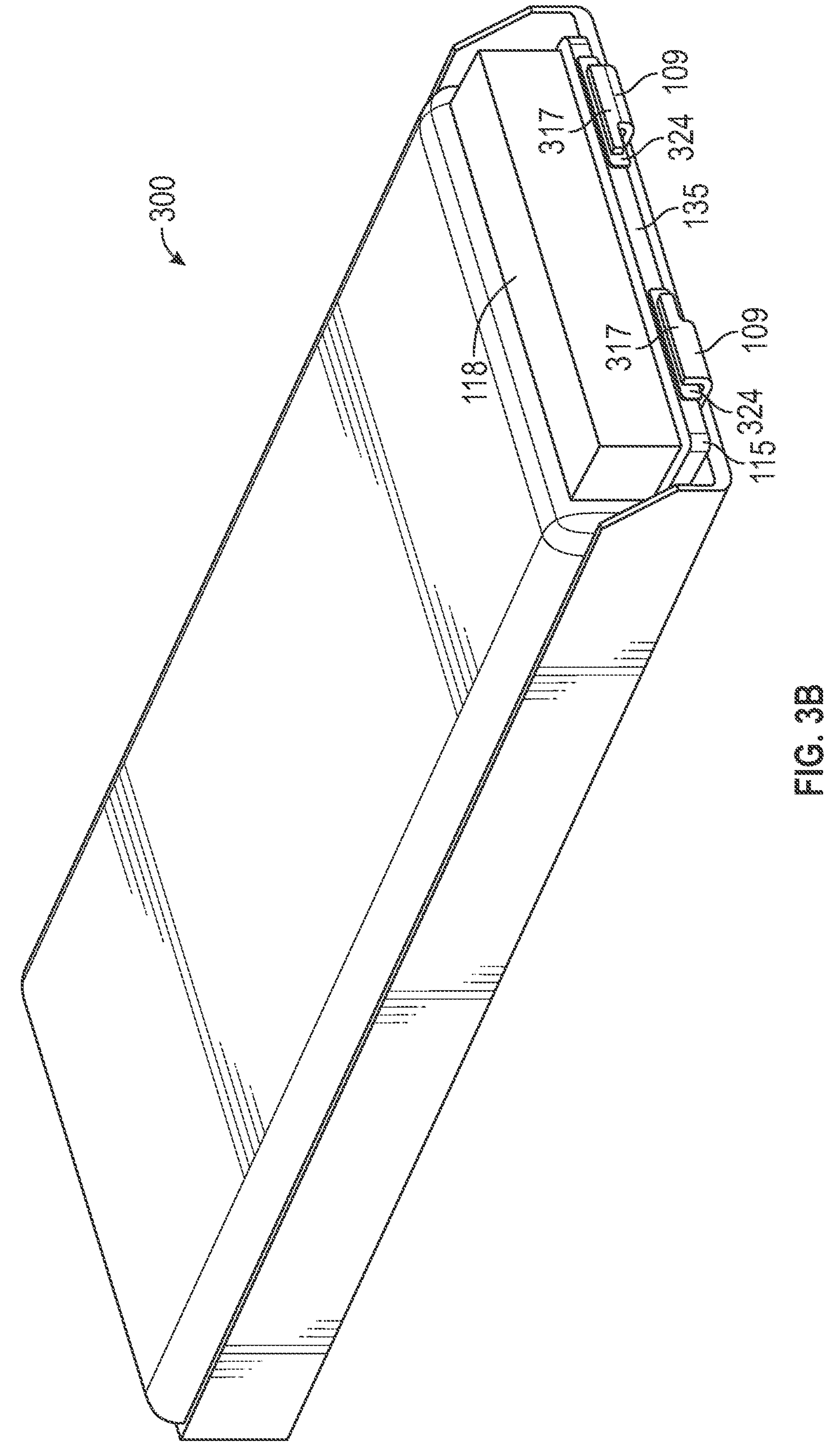
FIG. 3B is a schematic three-dimensional view, on a reduced scale, of a battery pack according to the example embodiment of FIG. 3A.

FIGS. 3A and 3B shows another example battery pack 300 that provides for a PCM component-receiving top face 124 that is uninterrupted by any electrode connections thereon. In the example battery pack 300, the electrodes 109 are connected to the edge face of the PCB 115, in particular being connected to the front edge face 135.

As can best be seen in FIG. 3A, the orientation of the PCB 115 in the battery pack 300 is similar to that which is the case in the previously described existing battery pack 100 (FIG. 1B), in that the thickness dimension of the PCB 115 (i.e., the direction extending between the top face 124 and the bottom face 125) is oriented transversely to the lengthwise direction of the battery cell 103. A main, connective electrode portion provided by an electrode 309 projects longitudinally from the battery cell 103, passes beneath the bottom face 125 of the PCB 115, and is bent substantially 90° such that terminal end portions 317 of the respective electrodes 109 lie flat against the PCB's front edge face 135, which is directed longitudinally away from the battery cell 103.

As can best be seen in FIG. 3B, the terminal end portions 317 of the electrodes 109 are widened relative to the width of the tab portions 309 of the electrodes 109. The front edge face 135 of the PCB 115 provides a pair of connection pads 324 that are somewhat greater in width than the terminal end portions 317 of the electrodes 109. In this example embodiment, the connection pads 324 are provided by gold-plated surfaces on the front edge face 135, connection of the electrodes 109 thereto being achieved by solder joint attachment of the terminal end portions 317 to the respective connection pads 324. In other embodiments, the electrodes 109 can be welded to the exposed gold pads 324. The connection pads 324 are conductively coupled to the integrated circuit of the PCB 115. In this example embodiment, the increased width of the terminal end portions 317 and connection pads 324 are selected such that the contact surface between the terminal end portions 317 and the connection pads 324 are at least as great as the corresponding contact surface between the conventionally structured electrodes 109 and the PCB 115 of existing battery packs, such as the battery pack 100 described with reference to FIG. 1.

Again, it can be seen that avoiding intrusion of the battery electrodes 109 into the PCM components area provided by the top face 124 makes substantially the entire flat surface of the top face 124 available to place PCM components. The additional free area on the top face 124 can be optimized for allowing a more compact PCB 115. For example, a PCB 115 that has a smaller width (i.e., a smaller spacing between the front and rear side edges 135, 136) can be provided that offers comparable PCM block volume that is the case with the existing battery pack 100 of FIG. 1. As mentioned previously, such space saving can translate to a shorter battery pack 300 for a given battery capacity, or can be used to increase battery capacity for a given battery pack size.

In some embodiments, arrangement of battery electrode connections to a PCM's PCB such that substantially an entire major outer face of the PCB is available for PCM component attachment is combined with a PCM nesting arrangement in which two separate battery cells or units share a common PCM, having a single PCB. One example embodiment of such an arrangement is illustrated schematically in FIG. 4A.

As can clearly be seen from the respective illustrations, the orientation of the PCB 115 and the connection thereof to a first battery cell 103.1 corresponds to the arrangement illustrated and discussed with reference to FIG. 2A and 2B. The PCB 115 thus has an upright orientation in which its widthwise direction is transverse to the lengthwise direction of the first battery cell 103.1, the thickness dimension of the PCB 115 being parallel to the lengthwise direction of the battery cell 103.1. The electrodes 109.1 of the first battery cell 103.1 are connected to the bottom face 125 of the battery cell 103, leaving a primary PCM block 118.1 on the top face 124 of the PCB 115 unimpeded by the electrodes 109.1. The top face 124 is opposed to and directed towards the battery cell 103.1.

The battery pack 400, however, includes a second, additional battery cell 103.2 which is substantially identical to the first battery cell 103.1. The second battery cell 103.2 is longitudinally aligned with the first battery cell 103.1, being arranged end-to-end with the first battery cell 103.1 with a longitudinal spacing between them, within which a common PCM 112 is housed for serving both battery cells 103.1, 103.2. Worded differently, the two battery cells of the battery pack 400 lie substantially in a common plane.

The electrodes 109.2 of the second battery cell 103.2 are conductively coupled to the PCB 115 on the same face as the connection of the electrodes 109.1 of the first battery cell 103.1, in this example embodiment being connected to the bottom face 125 of the PCB 115. The second battery cell 103.2 is inverted relative to the first battery cell 103.1, such that the electrodes 109.1, 109.2 of the respective battery cells extend toward opposite side edges of the PCB 115. In this example embodiment, the respective electrodes 109 of the pair of battery cells 103 are connected together at their common connection to the bottom face 125 of the PCB 115. Thus, the first battery electrodes 109.1 are soldered or welded to respective exposed copper connection pads on the bottom face 125, substantially covering the connection pads. The second battery electrodes 109.2 are in turn soldered or welded to the exposed rear surfaces of the first electrodes 109.1. In other embodiments, separate connection surfaces or pads may be provided on the bottom face 125 for all four electrodes 109.1, 109.2. In such embodiments, the second electrodes 109.2 are not attached to the first electrodes 109.1, but are instead soldered or welded directly to the PCB 115 at the bottom face 125.

As with the previously described example embodiments, the top face 124 of the PCB 115 is uninterrupted by any electrode connections, and is substantially entirely available for the attachment of PCM components in a primary PCM block 118.1. Additional PCM components are placed in a secondary PCM block 118.2 on those parts of the bottom face 125 that are not reserved for the electrode connections. The secondary PCM block 118.2 thus has three interrupted sub-blocks, being similar in arrangement and appearance to the PCM sub-blocks 118', 118", and 118'" of FIG. 1A.

Figure 4A:
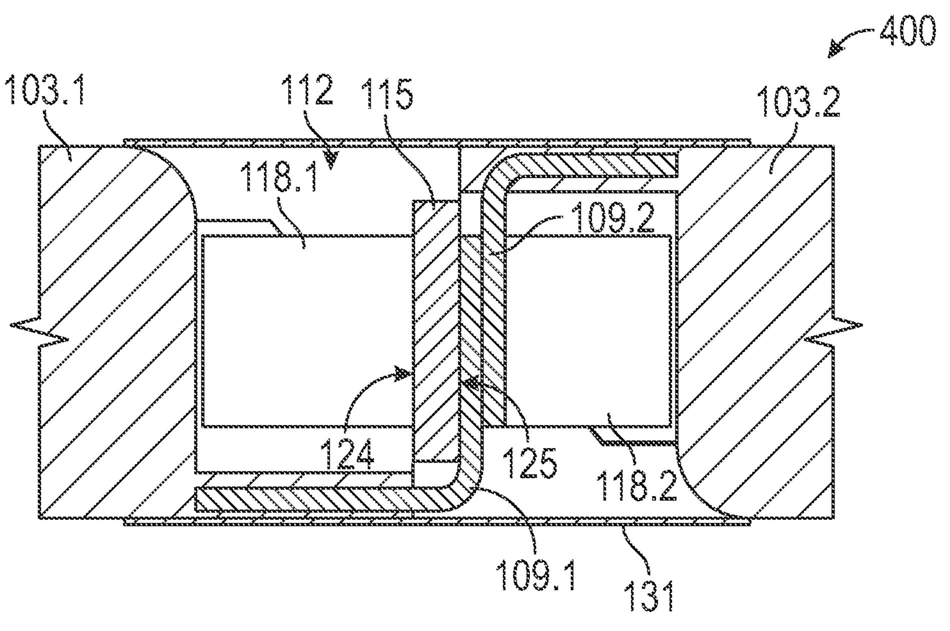
FIG. 4A is a partial cross-sectional view of a battery pack according to an example embodiment in which a pair of PCMs for a corresponding pair of battery cells share a common PCB.
Figure 4B:
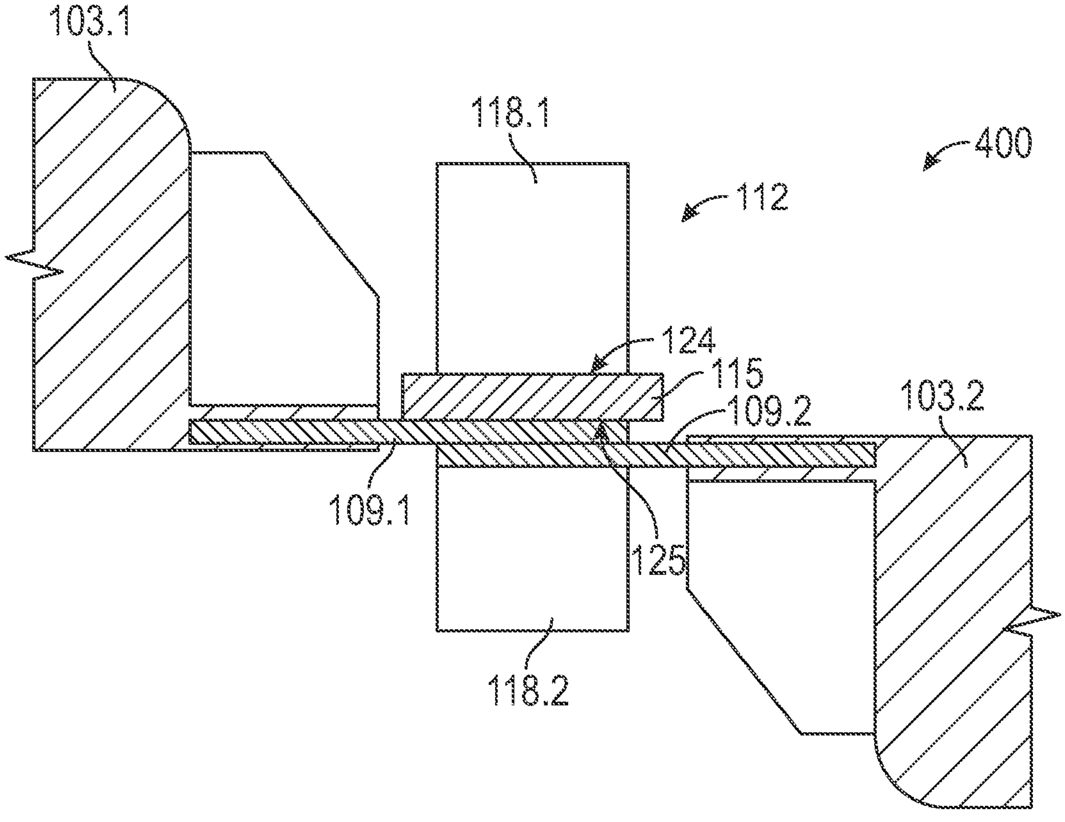
FIG. 4B is a view corresponding to FIG. 4A, showing an intermediate stage during manufacture of a battery pack according to the example embodiment of FIG. 4A.

FIG. 4B shows the spatial arrangement of different components of the battery pack 400 during an intermediate step of manufacturing the finalized battery pack 400 of FIG. 4A. To facilitate attachment of the electrodes 109.1, 109.2 to the PCB 115, respective electrode tabs in a rectilinear, unbent state are soldered or welded to the bottom face 125 of the PCB 115 while the PCB 115 is oriented such that its widthwise direction is aligned with the lengthwise directions of the battery cells 103.1, 103.2. Such a process results in the arrangement seen in FIG. 4B.

Thereafter, with the electrodes 109 firmly attached to the PCB 115, the PCM 112 (comprising the single, common PCB 115, the primary PCM block 118 8.1, and the second of the PCM block 118.2) is rotated through approximately 90° into its position shown in FIG. 4A. During such rotation of the PCM 112 relative to the battery cells, the respective electrode tabs 109.1, 109.2 are bent or folded to assume the shapes shown in FIG. 4A.

The described method of assembly of the battery pack 400 described with reference to the FIG. 4B has the benefit of providing greater accessibility to the PCB 115 during electrode attachment than would have been the case if the respective components were to be connected in the final position of FIG. 4.

Figure 5A:
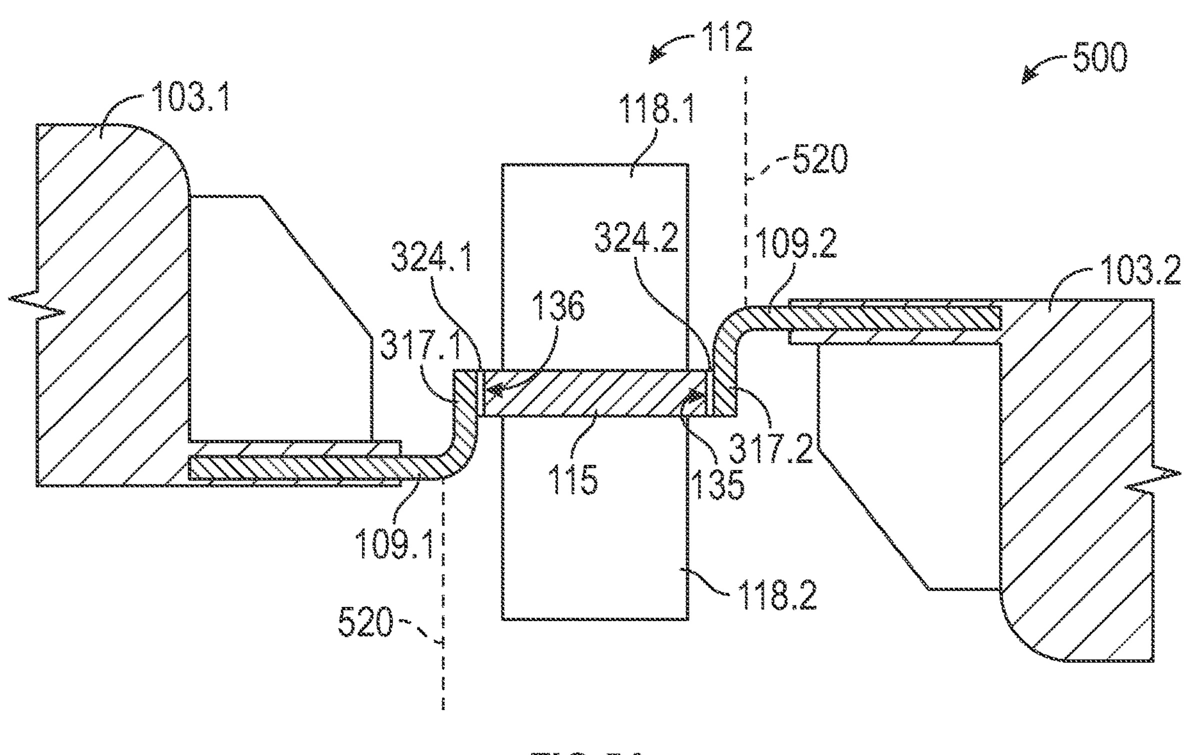
FIG. 5A is a view corresponding to FIG. 5B, showing an intermediate stage during manufacturing of a battery pack according to the example embodiment of FIG. 5B.
Figure 5B:
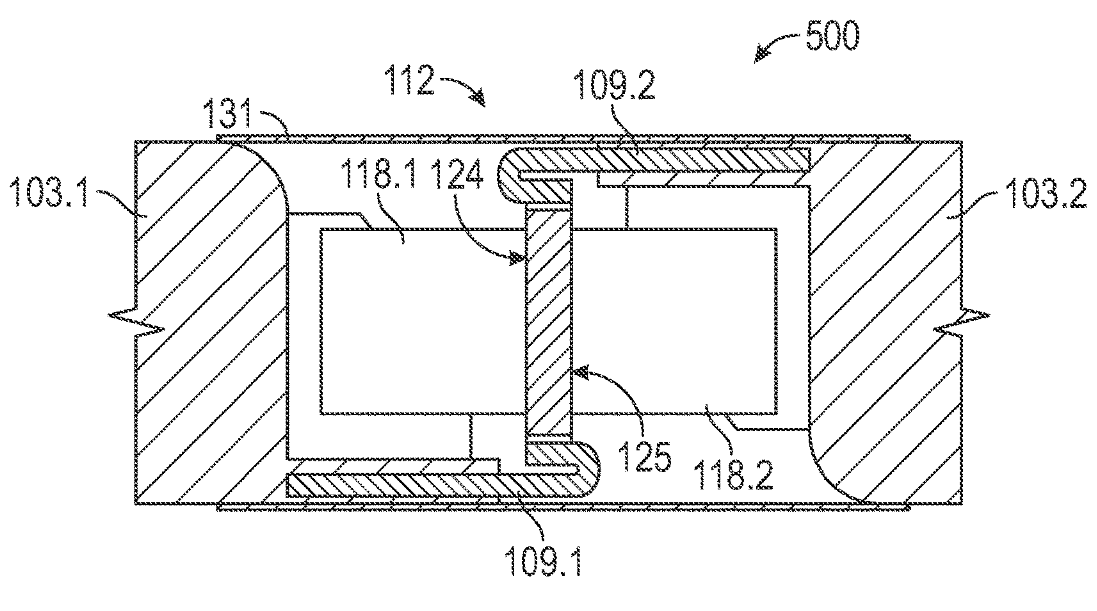
FIG. 5B is a partial cross-sectional view of a battery pack according to an example embodiment in which a pair of PCMs for a corresponding pair of battery cells share an edge-mounted PCB in common.

FIG. 5B shows a further example embodiment of a dual-cell battery pack 500 in a nested arrangement in which two battery cells 103.1, 103.2 share a single PCM 112 in common, with a single PCB 115 serving both battery cells of the battery pack 500. The battery pack 500 of FIG. 5 is thus similar in arrangement to the battery pack 400 of FIG. 4, with a major distinction being that the electrode connections are provided on the edge face of the PCB 115, rather than on the bottom face 125 as is the case in FIG. 4.

More particularly, each of the respective pair of battery electrodes 109.1, 109.2 is connected (in a manner substantially identical to that described with reference to FIGS. 3A and 3B) to a respective side edge face 135, 136 of the PCB 115. Thus, each side edge face of the PCB 115 is provided with a pair of widened copper terminal connection pads 324 connected to the integrated protection circuit of the PCB 115. Each of the four electrode tabs similarly has a respective widened end portion 317 that is connected to a respective one of the edge-mounted connection pads 324.1, 324.2 by soldering or welding.

FIG. 5A shows an intermediate step in the manufacturing of the finalized battery pack 500 of FIG. 5B. In the manufacturing of the battery pack 500, however, the respective end portions 317.1, 317.2 of the electrodes 109.1, 109.2 are soldered to the corresponding edge-mounted contact pads 324.1, 324.2 while the electrodes 109.1, 109.2 are rectilinear and extend in the directions indicated by dotted lines 520 in FIG. 5A. It will be appreciated that, in this position, the PCB 115 is oriented relative to the battery cells 103, 103' such that its widthwise dimension is transverse to the lengthwise direction of the battery cells 103, 103'.

Thereafter, the PCM 112 is rotated through 180° into its final position shown in FIG. 5B. This is achieved by folding the ends of the electrodes 109.1, 109.2 back on itself so that the electrode end portion 317.1, 317.2 point back towards the battery cell 103.1, 103.2 from which it projects. To achieve this 180° fold in the electrodes 109.1, 109.2, the electrode tabs are in this example given two separate closely spaced 90° folds or angles. FIG. 5A shows that the battery pack 500 after the first of these folds has been imported to the electrodes 109.1, 109.2. It will be appreciated that thus bending the electrodes 109.1, 109.2 draws the battery cells 103.1, 103.2 closer together, and rotates the PCM blocks 118 into their final positions shown in FIG. 5B.

A benefit of the described method of manufacturing described with reference to FIGS. 4B and 5A is that access to the PCB and the electrode end portions is easier in positions where the electrodes extend rectilinearly, before they are folded. This is in part due to the fact that the longitudinal spacing between the adjacent ends of the battery cells decreases when the PCB and the attached electrode end portions are rotated into their final positions. The exemplified method of manufacturing thus promotes manufacturing quality and requires less expensive tooling than would be the case if the electrodes were to be attached to the PCB in their final shapes and positions.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the disclosed matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A battery pack comprising:

a pair of electrochemical batteries for generating electrical power, each battery being an elongate modular unit having a lengthwise direction, the pair of batteries being arranged end-to-end in the lengthwise direction with a longitudinal gap between adjacent ends of the batteries;

a protective circuit board (PCB) having a pair of parallel major surfaces that define a first face and a second face on opposite sides of the PCB respectively, a peripheral edge face of the PCB extending transversely between the first and second faces, the PCB being positioned within the longitudinal gap between the batteries and oriented such that the first face and the second face are transverse to the lengthwise direction of the batteries, the first face facing toward one of the pair of batteries and the second face facing toward the other one of the pair of batteries;

a protection circuit module (PCM) comprising PCM components mounted on at least one of the first face and the second face of the PCB, the PCM components and PCB together being configured to control one or more functions of the pair of batteries, each PCM component being an electronic component mounted on the PCB such as to be electrically coupled to circuitry of the PCB; and an electrode arrangement that connects the pair of batteries to the PCB, wherein respective electrode connections for both of the pair of batteries are located at the first face of the PCB.

2. The battery pack of claim 1, wherein the second face of the PCB is free of any electrode connection.

3. The battery pack of claim 2, wherein in spatial arrangement of the PCB relative to the electrode arrangement is such that substantially the entirety of the second face is available for mounting of PCM components uninterrupted by the electrode arrangement.

4. The battery pack of claim 1, wherein the electrode arrangement comprises four electrode tabs provided by a respective pair of electrode tabs for each of the pair of batteries, all four of the electrode tabs being conductively connected to the first face.

5. The battery pack of claim 4, wherein the pairs of electrode tabs are connected to the PCB in a stacked configuration in which respective end portions of a first pair of electrode tabs lie flat against the first face of the PCB, and respective end portions of a second pair of electrode tabs lie flat against the corresponding end portions of the first pair of electrode tabs, such that the second pair of electrode tabs are indirectly coupled to the PCB via the first pair of electrode tabs, to which the second pair of electrode tabs are directly coupled.

6. The battery pack of claim 5, wherein the first face of the PCB provides a pair of exposed metal connection pads, wherein respective front surfaces of the first pair of electrode tabs are soldered or welded to the pair of connection pads, substantially covering the connection pads, respective rear surfaces of the first pair of electrode tabs facing away from the PCB; and wherein the second pair of electrode tabs are soldered or welded to the rear surfaces of the first pair of electrode tabs.

7. The battery pack of claim 5, wherein each electrode tab comprises:

a main portion projecting away from the respective battery towards the PCB, the main portion of each electrode tab extending transversely relative to the first face of the PCB; and a respective end portion that is bent normally from the main portion to be parallel with the first face of the PCB, to which it is connected.

8. The battery pack of claim 7, wherein:

the main portions of the electrode tabs of one of the pair of batteries extend from the respective battery, past the edge face of the PCB and onto the first face of the PCB, and wherein the main portions of the electrode tabs of the other one of the pair of batteries extend between their battery and the first face of the PCB without extending past the PCB edge face.

9. The battery pack of claim 5, wherein the PCM components mounted on the first face are arranged in three sub-blocks interrupted by the two pairs of stacked electrode end portion connections.

10. The battery pack of claim 4, wherein the PCM is located within the longitudinal gap between the pair of batteries.

11. The battery pack of claim 2, wherein the electrode arrangement includes a pair of electrode tabs extending from one of the pair of batteries, each electrode tab of said pair comprising:

a main portion projecting away from the respective battery in the lengthwise direction, the main portion extending from the second face side of the PCB, past the peripheral edge face of the PCB; and an end portion that is bent from the main portion to lie flat against the first face of the PCB, such that the end portion is connected to the PCB at the first face on a side of the PCB that is directed away from the battery from which said pair of electrode tabs projects.

* * * * *